US 9,384,939 B2

(12) United States Patent
Itagaki et al.

(10) Patent No.: US 9,384,939 B2
(45) Date of Patent: Jul. 5, 2016

(54) ELECTRON BEAM WRITING APPARATUS AND OUTPUT CONTROL METHOD

(71) Applicant: NuFlare Technology, Inc., Yokohama-shi (JP)

(72) Inventors: Kennosuke Itagaki, Kanagawa-ken (JP); Takiji Ishimura, Kanagawa-ken (JP); Hiroyoshi Ando, Kanagawa-ken (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 14/936,861

(22) Filed: Nov. 10, 2015

(65) Prior Publication Data

US 2016/0141143 A1 May 19, 2016

(30) Foreign Application Priority Data

Nov. 13, 2014 (JP) ................. 2014-230488

(51) Int. Cl.
*H01J 37/147* (2006.01)
*H01J 37/317* (2006.01)

(52) U.S. Cl.
CPC ......... *H01J 37/1472* (2013.01); *H01J 37/3174* (2013.01); *H01J 2237/15* (2013.01); *H01J 2237/31725* (2013.01)

(58) Field of Classification Search
USPC ........................... 250/396 R, 492.1
See application file for complete search history.

(56) References Cited

U.S. PATENT DOCUMENTS

2007/0229337 A1* 10/2007 Sanmiya ............. H03M 1/1071
341/144

FOREIGN PATENT DOCUMENTS

JP              2013-5330         1/2013

* cited by examiner

*Primary Examiner* — Kiet T Nguyen
(74) *Attorney, Agent, or Firm* — Oblon, McClelland, Maier & Neustadt, L.L.P.

(57) ABSTRACT

An output control method according to an embodiment is to control an output by a deflection amplifier that outputs a voltage signal to a deflection electrode of an electron beam writing apparatus. The voltage signal is proportional to input data, and the method includes: performing, for the voltage signal generated by synthesizing respective outputs by a plurality of D/A converters to which a control range of the voltage signal is assigned, the respective outputs by the plurality of D/A converters being proportional to respective inputs, sampling on at least either a lower limit value of the voltage signal within the control range or an upper limit value thereof; and generating a correction value to correct the output by the D/A converter based on the sampling result.

14 Claims, 12 Drawing Sheets

FIG.5

| Din(20) | D4 | D3 | D2 | D1 | D5 |
|---|---|---|---|---|---|
| c | 0 | 0 | 0 | 0 | 0 |
| b | | | ⋮ | ⋮ | ⋮ |
| ⋮ | | | | | |
| a+1 | | ⋮ | 0 | Y | 0 |
| a | | | 0 | Y | a1 |
| ⋮ | ⋮ | | ⋮ | | ⋮ |
| 0 | | 0 | Y | | a1 |
| e | | 0 | Y | | a2 |
| ⋮ | | ⋮ | | ⋮ | ⋮ |
| d | 0 | Y | | | a2 |
| d−1 | 0 | Y | ⋮ | | a3 |
| ⋮ | ⋮ | ⋮ | | | ⋮ |
| c+2 | | | | | |
| c+1 | Y | Y | Y | Y | a3 |

FIG.13

CORRECTION TABLE

| Din(20) | M |
|---|---|
| c | M(c) |
| b | M(b) |
| ⋮ | ⋮ |
| a+1 | M(a+1) |
| a | M(a) |
| ⋮ | ⋮ |
| 0 | M(0) |
| e | M(e) |
| ⋮ | ⋮ |
| d | M(d) |
| d−1 | M(d−1) |
| ⋮ | ⋮ |
| c+2 | M(c+2) |
| c+1 | M(c+1) |

ELECTRON BEAM WRITING APPARATUS AND OUTPUT CONTROL METHOD

CROSS REFERENCE TO RELATED APPLICATIONS

This application is based upon and claims the benefit of priority from the prior Japanese Patent Application No. 2014-230488 filed in Japan on Nov. 13, 2014; the entire contents of which are incorporated herein by reference.

FIELD

The present disclosure relates to an output control method and an electron beam writing apparatus.

BACKGROUND

In lithography processes for manufacturing semiconductor devices, such as flash memories and Central Processing Units (CPUs), an original writing pattern formed in a mask is transferred to a semiconductor wafer. In recent years, the original writing patterns formed in respective masks are generally written using an electron beam writing apparatus.

When a pattern is written on the mask using an electron beam writing apparatus, deflection electrodes are controlled by voltages applied from a deflection amplifier to focus electron beam on a desired position on the mask. Hence, in order to precisely write a micropattern, a calibration of the deflection amplifier that applies voltages to the deflection electrodes should be carried out before writing the pattern on the mask.

BRIEF DESCRIPTION OF THE DRAWINGS

FIG. 5 is a diagram illustrating a correspondence relationship among input data;
FIG. 13 is a diagram illustrating a correction table.

DETAILED DESCRIPTION

An output control method according to an embodiment of the present disclosure is an output control method of controlling an output by a deflection amplifier that outputs a voltage signal to a deflection electrode of an electron beam writing apparatus, the voltage signal being proportional to input data.

The output control method includes a performing, for the voltage signal generated by synthesizing respective outputs by multiple D/A converters to which respective control ranges of the voltage signal are assigned, the respective outputs by multiple D/A converters being proportional to respective inputs, sampling on at least either a lower limit value of the voltage signal within the control range or an upper limit value thereof, and, generating a correction value to correct the output by the D/A converter based on the sampling result.

An electron beam writing apparatus according to this embodiment is an electron beam writing apparatus which writes a pattern by emitting electron beam to a target object.

The electron beam writing apparatus includes a deflection electrode that causes the electron beam emitted to the target object to be deflected, and a deflection amplifier that includes a synthesizer which synthesizes input voltages and outputs a voltage signal which is proportional to input data and which is input to the deflection electrode, multiple D/A converters to which respective control ranges of the voltage signal are assigned, respective output voltages by the multiple D/A converters being proportional to respective inputs, and a storage which stores a correction value in association with the input data to be input into the deflection amplifier, and which outputs the correction value according to the input data, and a corrector D/A converter which outputs, to the synthesizer, a voltage with a value according to the correction value from the storage. The correction value is generated based on at least either a lower limit value of the voltage signal within the control range assigned to each D/A converter or an upper limit value thereof.

Figure 1:
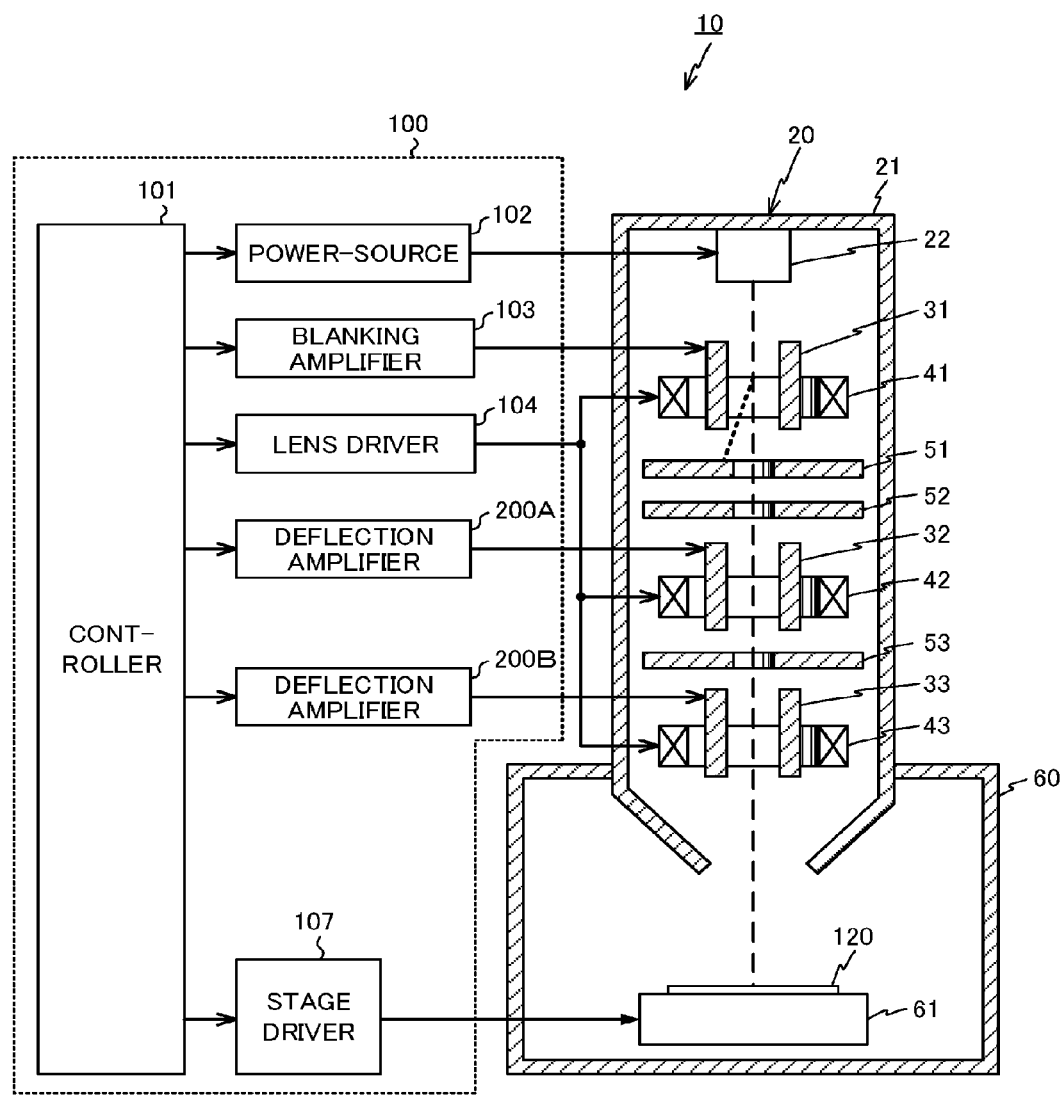
FIG. 1 is a schematic diagram illustrating an electron beam writing apparatus according to an embodiment.

An embodiment of the present disclosure will be explained below with reference to the accompanied figures. FIG. 1 is a diagram illustrating a general structure of an electron beam writing apparatus 10 according to this embodiment. The electron beam writing apparatus 10 writes a pattern on a material 120, such as a mask or a reticle coated with a resist, under a vacuum environment of substantially $10^{-7}$ Pa.

As illustrated in FIG. 1, the electron beam writing apparatus 10 includes an emitting unit 20 that emits electron beam to the material 120, a writing chamber 60, and a control system 100.

In the emitting unit 20, there are arranged a lens barrel 21 that has the lengthwise direction in parallel with the vertical direction, an electron gun 22, beam deflectors 31, 32, 33, lenses 41, 42, 43 corresponding to the beam deflectors 31, 32, 33 respectively and apertures 51, 52, 53. In the writing chamber 60, there is arranged a stage 61 on which the material 120 is mounted.

The lens barrel 21 is a cylindrical casing having an opened bottom. The lens barrel 21 is formed of stainless steel, and is electrically grounded. This lens barrel 21 is placed on the writing chamber 60, and a portion located inside the writing chamber 60 is formed in a tapered shape that decreases the diameter toward the bottom (–Z direction).

The electron gun 22 is disposed in the internal upper space of the lens barrel 21. For example, the electron gun 22 is a hot cathode electron gun. The electron gun 22 includes a cathode, a Wehnelt electrode that encircles the cathode, an anode disposed below the cathode, and the like. When a voltage is applied, the electron gun 22 emits electron beam toward the material 120.

A beam deflector 31 is disposed below the electron gun 22. The beam deflector 31 includes electrodes disposed so as to face with each other. In addition, the beam deflector 31 deflects the electron beam emitted by the electron gun 22 according to a voltage applied by a blanking amplifier 103.

For example, a binary voltage signal which becomes high level and low level is input into one of the two electrodes of the beam deflector 31. When the input voltage signal is the high level, an electric field is generated between the electrodes of the beam deflector 31, thereby, the electron beam deviates from a hole in the center of the aperture 51 and is blocked by the aperture 51. Accordingly, by inputting the voltage signal modulated based on a writing pattern into the beam deflector 31, a desired pattern can be written in the material 120. In addition, by inputting the voltage signal maintained at the high level into the beam deflector 31, the blanking condition of the electron beam can be maintained.

The lens 41 is an annular lens that encircles the beam deflector 31. The lens 41 converges the electron beam which has passed through the beam deflector 31, toward the substantial center of the aperture 51.

The apertures 51, 52 are each a plate member provided with an opening at the center thereof. The electron beam passes through the opening. The apertures 51, 52 are disposed near the focal point of the electron beam that has passed through the lens 41. By causing the electron beam to pass through the respective openings of the apertures 51, 52, the shape of the electron-beam spot is adjusted. In addition, when the beam deflector 31 deflects the electron beam, such electron beam is blocked by the aperture 51. Hence, electron-beam blanking is performed.

The beam deflector 32 is disposed below the aperture 52. The beam deflector 32 includes multiple pairs of electrodes disposed so as to face with each other in each pair. The beam deflector 32 deflects the electron beam that has passed through the aperture 52 in accordance with the voltage applied to the electrodes.

The lens 42 is an annular lens that encircles the beam deflector 32. The lens 42 converges the electron beam that has passed through the beam deflector 32 toward the substantial center of the aperture 53.

The aperture 53 is disposed below the beam deflector 32. The aperture 53 employs the same structure as those of the apertures 51, 52. By causing the electron beam to pass through the opening of the aperture 53, the shape of the electron-beam spot is adjusted.

The beam deflector 33 is disposed below the aperture 53. The beam deflector 33 includes multiple pairs of electrodes disposed so as to face with each other in each pair. The beam deflector 33 deflects the electron beam passing through the aperture 53 in accordance with the applied voltage to the electrodes.

The lens 43 is an annular lens that encircles the beam deflector 33. The lens 43 that works together with the beam deflector 33 focuses the electron beam passing through the beam deflector 33 toward a desired position on the material 120 mounted on the stage 61.

The writing chamber 60 is a hollow member formed in a cuboid shape, and a circular opening is formed in the top face of the writing chamber 60. The above-explained lens barrel 21 of the emitting unit 20 has a part fitted in the opening formed in the top face of the writing chamber 60.

The stage 61 is disposed inside the writing chamber 60. The stage 61 is movable along at least a horizontal plane with the material 120 in which a pattern is to be written being held substantially horizontally.

The control system 100 controls the emitting unit 20 and the stage 61. This control system 100 includes a controller 101, a power-source 102, the blanking amplifier 103, a lens driver 104, deflection amplifiers 200A, 200B, and a stage driver 107.

Figure 2:
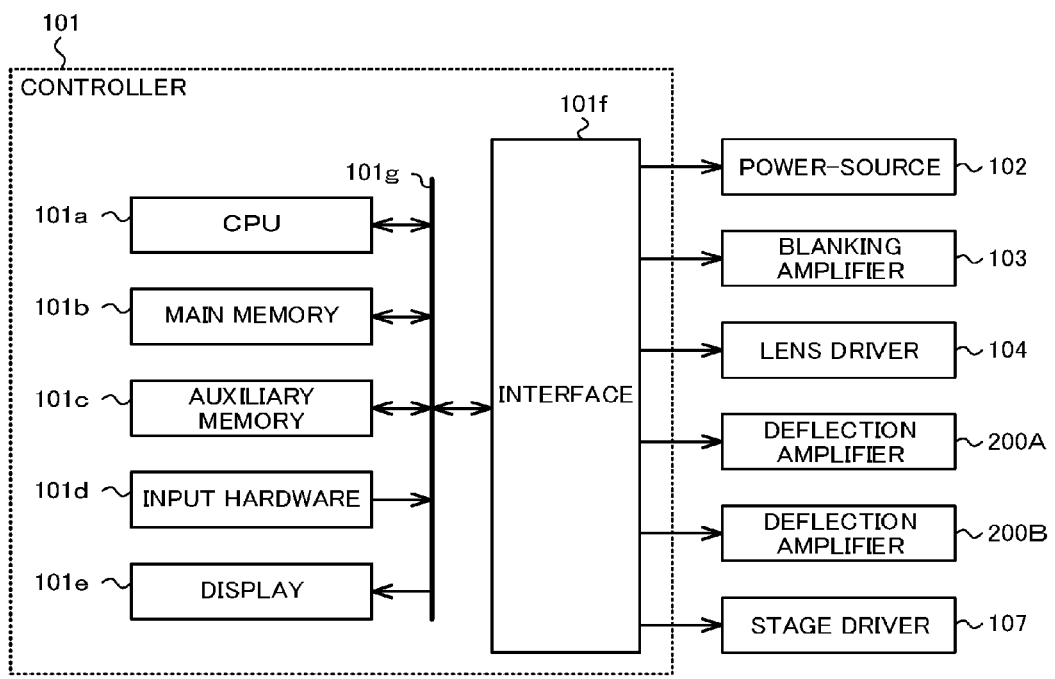
FIG. 2 is a schematic diagram of a controller.

FIG. 2 is a block diagram of the controller 101. As illustrated in FIG. 2, the controller 101 is a computer that includes a Central Processing Unit (CPU) 101*a*, a main memory 101*b*, an auxiliary memory 101*c*, an input hardware 101*d*, a display 101*e*, an interface 101*f*, and a system bus 101*g* which connects those components one another.

The CPU 101*a* reads and executes a program stored in the auxiliary memory 101*c*. The CPU 101*a* comprehensively controls the devices that construct the control system 100 according to the program.

The main memory 101*b* includes a volatile memory like a Random Access Memory (RAM). The main memory 101*b* is utilized as a work area for the CPU 101*a*.

The auxiliary memory 101*c* includes a non-volatile memory, such as a Read Only Memory (ROM), a magnetic disk, or a semiconductor memory. The auxiliary memory 101*c* stores the program to be executed by the CPU 101*a*, various parameters, and the like. In addition, the auxiliary memory 101*c* sequentially stores information including a process result by the CPU 101*a*.

The input hardware 101*d* includes pointing devices, such as a keyboard and a mouse. An instruction given by a user is input through the input hardware 101*d*, and is transmitted to the CPU 101*a* through the system bus 101*g*.

The display 101*e* includes a display unit like a Liquid Crystal Display (LCD). The display 101*e* displays, for example, information on the status of the electron beam writing apparatus 10 and on a writing pattern.

The interface 101*f* includes a LAN interface, a serial interface, a parallel interface, an analog interface, and the like. The power-source 102, the blanking amplifier 103, the lens driver 104, the deflection amplifiers 200A, 200B, and the stage driver 107 are all connected with the controller 101 through the interface 101*f*.

The controller 101 employing the above structure comprehensively controls the power-source 102, the blanking amplifier 103, the lens driver 104, the deflection amplifiers 200A, 200B, and the stage driver 107.

Returning to FIG. 1, the power-source 102 applies a voltage to the electron gun 22 based on an instruction from the controller 101. Hence, electron beam is emitted to the material 120 from the electron gun 22.

The blanking amplifier 103 generates a blanking signal based on a digital signal output by the controller 101. Next, the blanking amplifier 103 outputs the generated blanking signal to the beam deflector 31. The blanking signal is a binary signal. For example, high level is 500 mV and a low level is 0 V. When the blanking signal output to the beam deflector 31 is the high level, the electron-beam blanking is performed.

The lens driver 104 controls respective powers (refracting powers) of the lenses 41, 42 relative to the electron beam based on an instruction from the controller 101 to converge the electron beam toward the respective centers of the apertures 51 to 53, and also controls the power of the lens 43 to focus the electron beam toward the top face of the material 120.

The stage driver 107 drives the stage 61 to move and position the material 120 based on an instruction from the controller 101.

The deflection amplifier 200A generates a voltage signal based on the digital signal output by the controller 101 and outputs the generated voltage signal to the electrodes that construct the beam deflector 32. A potential difference V1 is produced across the electrodes that construct the beam deflector 32. Hence, the electron beam passing through the beam deflector 32 are deflected by what corresponds to the potential difference V1.

Figure 3:
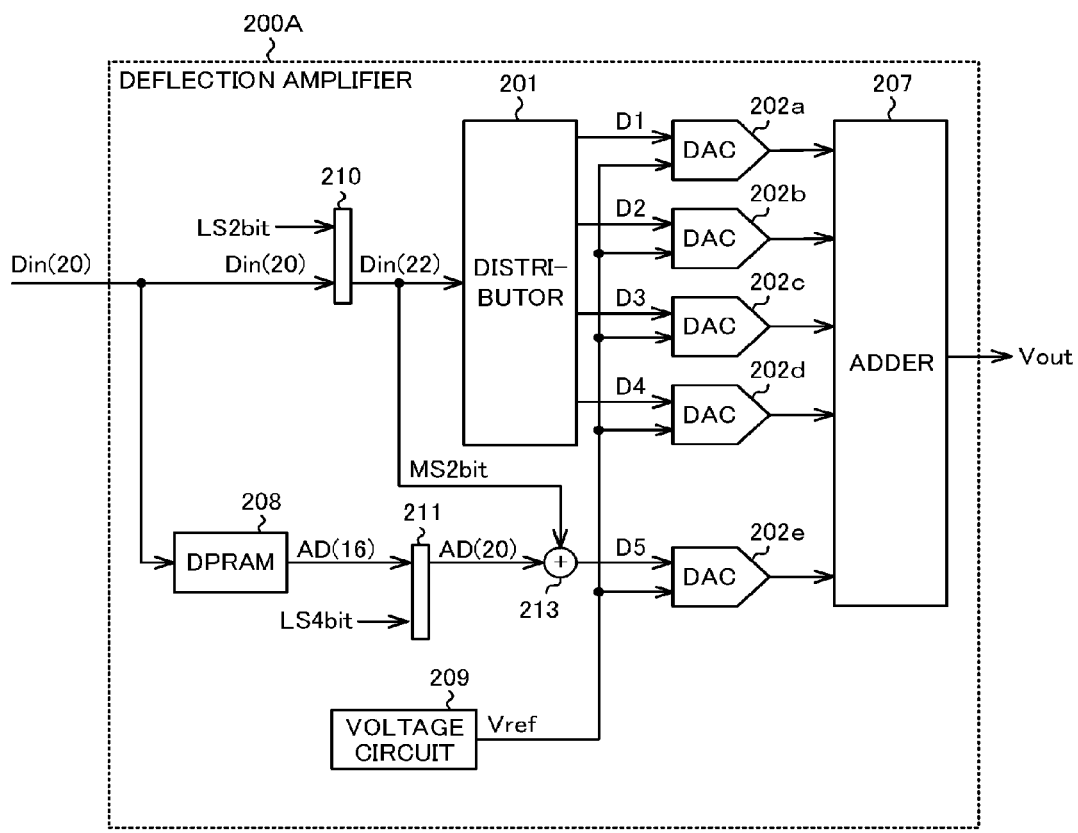
FIG. 3 is a schematic diagram of a deflection amplifier.

FIG. 3 is a block diagram of the deflection amplifier 200A. As illustrated in FIG. 3, the deflection amplifier 200A includes a distributor 201, D/A converters 202a to 202e, an adder 207, a Dual Port RAM (DPRAM) 208, and the like.

Input into the deflection amplifier 200A from the controller 101 is input data Din(20). The input data Din(20) is 20-bit data to define the value of a voltage signal Vout output by the adder 207. Two bits of data are added to the end of the input data Din(20) by a computing element 210. Thus the input data Din(20) becomes 22-bit input data Din(22). This input data Din(22) is input into the distributor 201.

When, for example, the Din(20) is [0111, 1111, 1111, 1111, 1111], this Din(20) is converted into an offset binary. Hence, [1111, 1111, 1111, 1111, 1111] is generated, and is subjected to a sign inversion. Accordingly, the Din(20) is converted into [0000, 0000, 0000, 0000, 0000]. Next, two bits of data are added to the end of the Din(20), and eventually, Din(22) that is [00, 0000, 0000, 0000, 0000, 0000] is input into the distributor 201 from the computing element 210. The conversion to the offset binary is performed by converting the most significant value that indicates the sign of the Din(20). When, for example, the most significant bit of the Din(20) is 1, this bit becomes 0. In addition, when the most significant bit of the Din(20) is 0, this bit becomes 1.

Still further, when, for example, the Din(20) is [1000, 0000, 0000, 0000, 0001], this Din(20) is converted to an offset binary. Hence, [0000, 0000, 0000, 0000, 0001] is generated, and is subjected to a sign inversion. Accordingly, the Din(20) is converted to [1111, 1111, 1111, 1111, 1110]. Next, two bits of data are added to the end of the Din(20), and eventually, Din(22) that is [11, 1111, 1111, 1111, 1111, 1000] is input into the distributor 201 from the computing element 210.

Yet still further, when, for example, the Din(20) is [1101, 1101, 1101, 1101, 1101], this Din(20) is converted to an offset binary. Hence, [0101, 1101, 1101, 1101, 1101] is generated, and is subjected to a sign inversion. Accordingly, the Din(20) is converted to [1010, 0010, 0010, 0010, 0010]. Next, two bits of data are added to the end of the Din(20), and eventually, Din (22) that is [10, 1000, 1000, 1000, 1000, 1000] is input into the distributor 201 from the computing element 210.

The distributor 201 takes out lower-20-bit data D(20) from the input data Din(22). Next, the distributor 201 input the data D(20) into any one of the D/A converters 202a to 202d in accordance with the upper 2 bits of the Din(22). In addition, in accordance with the upper 2 bits of the Din(22), the distributor 201 input the maximum value or the minimum value of the variable range of the D(20) into the D/A converters 202a to 202d other than the D/A converters 202a to 202d to which the D(20) has been input.

The data D(20) taken out from the input data Din(20) is, for example, data which has the minimum value of 0 and which also has the maximum value of e.

When the upper 2 bits of the Din(20) is 00, the D(20) is output to the D/A converter 202a as D1. When, for example, [00, 0000, 0000, 0000, 0000, 0000] is input into the distributor 201 as the Din(22), [0000, 0000, 0000, 0000, 0000] is extracted as the D(20). Next, this D(20) is output to the D/A converter 202a as the D1.

When the upper 2 bits of the Din(20) is 01, the D(20) is output to the D/A converter 202b as D2. When, for example, [01, 1000, 1000, 1000, 1000, 1000] is input into the distributor 201 as the Din(22), [1000, 1000, 1000, 1000, 1000] is extracted as the D(20). Next, this D(20) is output to the D/A converter 202b as the D2.

When the upper 2 bits of the Din(20) is 10, the D(20) is output to the D/A converter 202c as D3. When, for example, [10, 1000, 1000, 1000, 1000, 1000] is input into the distributor 201 as the Din(22), [1000, 1000, 1000, 1000, 1000] is extracted as the D(20). Next, this D(20) is output to the D/A converter 202c as the D3.

When the upper 2 bits of the Din(20) is 11, the D(20) is output to the D/A converter 202d as D4. When, for example, [11, 1111, 1111, 1111, 1111, 1000] is input into the distributor 201 as the Din(22), [1111, 1111, 1111, 1111, 1000] is extracted as the D(20). Next, this D(20) is output to the D/A converter 202d as the D4.

The data D1, D2, D3, and D4 define the output by each D/A converter 202a to 202d. Those data D1, D2, D3, and D4 have, for example, the minimum value of 0 and the maximum value of e.

Figure 4:
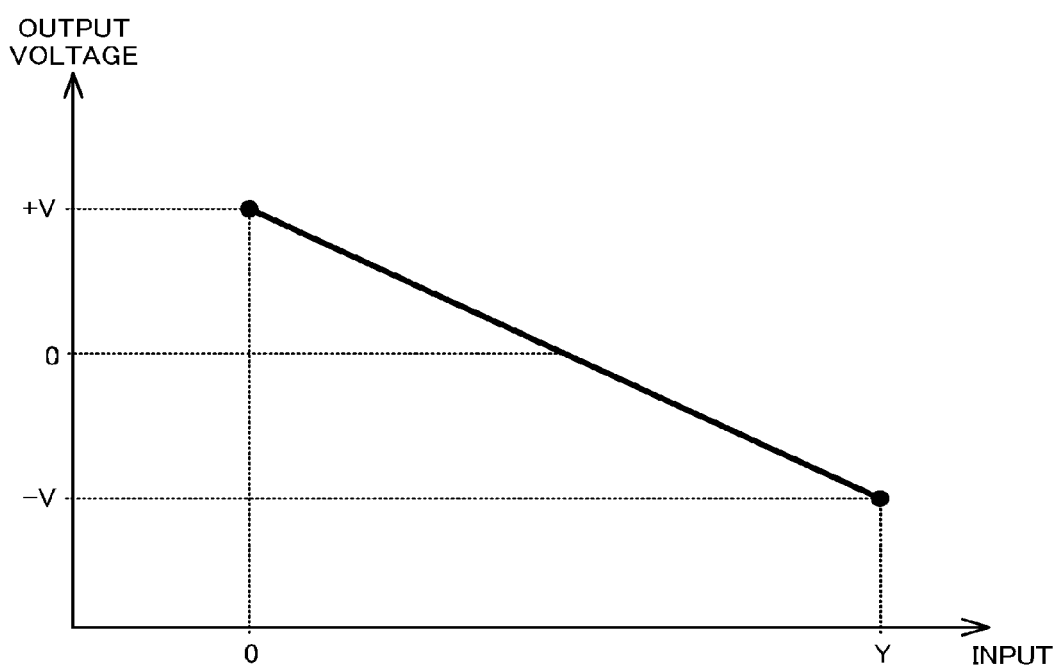
FIG. 4 is a diagram illustrating an output characteristic of a D/A converter.

FIG. 4 is a diagram illustrating characteristics of the D/A converters 202a to 202d. The D/A converters 202a to 202d are each a converter that has a 20-bit input. The D/A converters 202a to 202d each output a voltage according to the input with reference to a reference voltage Vref. As illustrated in FIG. 4, the D/A converters 202a to 202d each have a linear characteristic. Hence, the D/A converters 202a to 202d output voltages proportional to the values of respective input digital data.

The digital data input into the respective D/A converters 202a to 202d are the aforementioned input data D1 to D4. When the input data D1 to D4 has a minimum value 0, the D/A converters 202a to 202d each output a maximum voltage +V. In addition, when the input data D1 to D4 has a maximum value Y, the D/A converters 202a to 202d each output a minimum voltage −V.

FIG. 5 is a diagram illustrating a relationship between the input data Din(20) and the input data D1 to D4 generated by the distributor 201. The input data Din(20) is data represented by a hex number, and is data with a value between the minimum value 0 and the maximum value 1048575. In FIG. 5, in order to clarify the illustration purpose, 262143, 262144, 463121, 524287, 524288, 524289, 786431, 786432, and 1048575 are indicated as a, a+1, b, c, c+1, c+2, d−1, d, and e, respectively. In addition, illustration of data other than data indicated as 0 and a to e is omitted.

Figure 6:
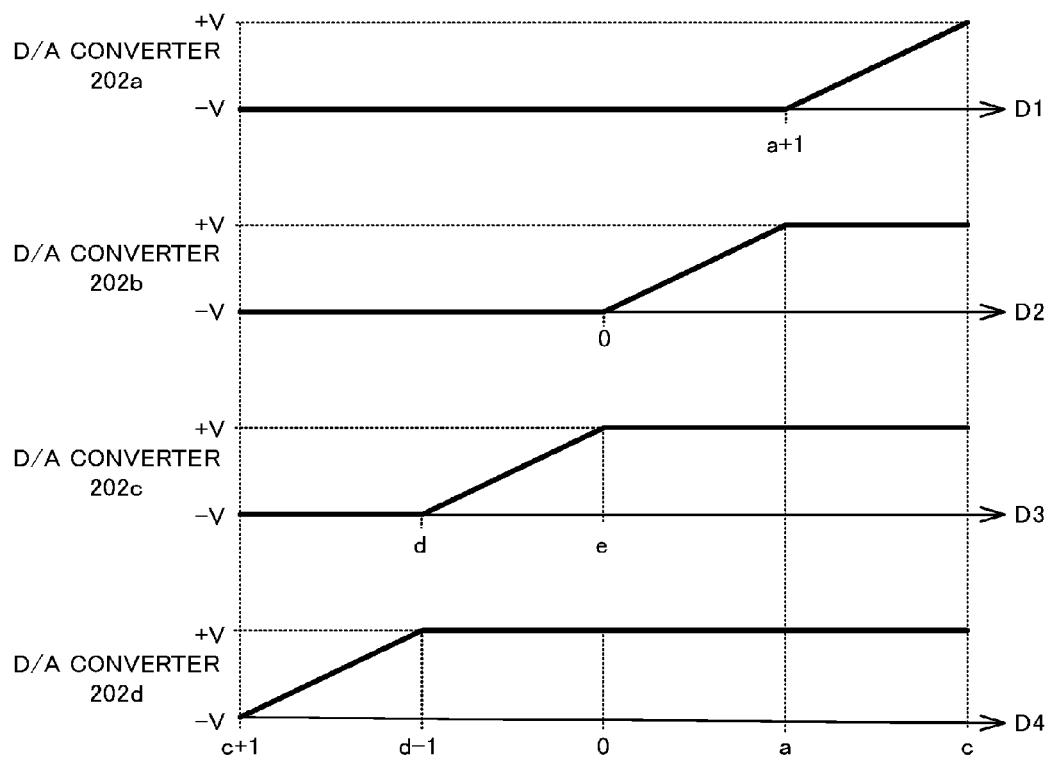
FIG. 6 is a diagram illustrating an output characteristic of a D/A converter.

As illustrated in FIG. 5, when the input data Din(20) is equal to or greater than a+1 and is equal to or smaller than c, the input data D1 becomes the D(20). And, the values of the input data D2 to D4 become 0. Hence, when the input data Din(20) is equal to or greater than a+1 and is equal to or smaller than c, as illustrated in FIG. 6, the output voltage by the D/A converter 202a is any value between −V and +V, and the output voltages by the respective D/A converters 202b to 202d become +V.

When the input data Din(20) is equal to or greater than 0 and is equal to or smaller than a, the input data D2 becomes the D(20). And, the value of the input data D1 becomes Y, the values of the input data D3, D4 become 0. Hence, as illustrated in FIG. 6, when the input data Din(20) is equal to or greater than 0 and is equal to or smaller than a, the output voltage by the D/A converter 202b becomes any value between −V and +V. In addition, the output voltage by the D/A converter 202a becomes −V, and the output voltages by the respective D/A converters 202c, 202d become +V.

When the input data Din(20) is equal to or greater than d and is equal to or smaller than e, the input data D3 becomes the D(20). And, the values of the input data D1, D2 become Y, and the value of the input data D4 becomes 0. Hence, when the input data Din(20) is equal to or greater than d and is equal to or smaller than e, as illustrated in FIG. 6, the output voltage by the D/A converter 202*c* becomes any value between −V and +V. In addition, the output voltages by the respective D/A converters 202*a*, 202*b* become −V, and the output voltage by the D/A converter 202*d* becomes +V.

When the input data Din(20) is equal to or greater than c+1 and is equal to or smaller than d−1, the input data D4 becomes the D(20). And, the values of the input data D1 to D3 become Y. Hence, when the input data Din(20) is equal to or greater than c+1 and is equal to or smaller than d−1, as illustrated in FIG. 6, the output voltage by the D/A converter 202*d* becomes any value between −V and +V, and the output voltages by the respective D/A converters 202*a* to 202*c* become −V.

Figure 7:
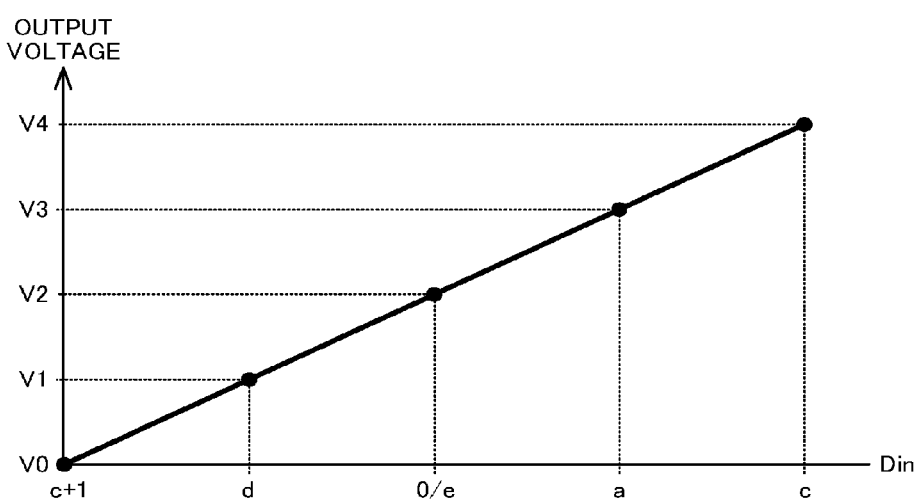
FIG. 7 is a diagram illustrating a characteristic of an output voltage.

Hence, as illustrated in FIG. 7, the relationship between a voltage obtained by summing each output voltage of each D/A converter 202*a* to 202*d*, and, the input data Din(20) has a substantially linear characteristic.

Returning to FIG. 3, the D/A converter 202*e* is a converter that is applied to correct a voltage signal Vout output by the deflection amplifier 200A. Like the D/A converters 202*a* to 202*d*, the D/A converter 202*e* has a linear characteristic, and outputs a voltage proportional to the value of the input digital data.

The digital data input into the D/A converter 202*e* is input data D5 output by an adder 213. The input data D5 is generated by the adder 213. The adder 213 generate the input data D5 by adding the upper 2 bits (MS 2 bit) of the Din(20) to the input data AD(20). Hence, the input data D5 can be deemed as data that contains the input data AD(20) and the upper 2 bits of the input data Din(20).

The input data AD(20) constituting the input data D5 is applied as data to correct the voltage signal Vout. In addition, the upper 2 bits of the input data Din(20) is applied as data to correct the strain of each output by each D/A converter 202*a* to 202*d*.

The output strain is a phenomenon that is caused when the output by each D/A converter 202*a* to 202*d* does not change even if the value of the input data Din(20) changes. More specifically, when the control range of the voltage signal Vout from the deflection amplifier 200A is assigned to the multiple D/A converters, even if the value of the input data Din(20) changes linearly, at the boundary between the adjoining control ranges, the outputs by the D/A converters 202*a* to 202*d* overlap. Consequently, the voltage signal Vout output by the adder 60 contains a strain.

For example, as is clear from FIG. 5, when the input data Din(20) changes from a to a+1, the values of the input data D2 to D4 are still 0, and the value of the input data D1 is still Y. In addition, when the input data Din(20) changes from e to 0, the values of the input data D3, D4 are still 0, and the values of the input data D1, D2 are still Y.

Figure 8:
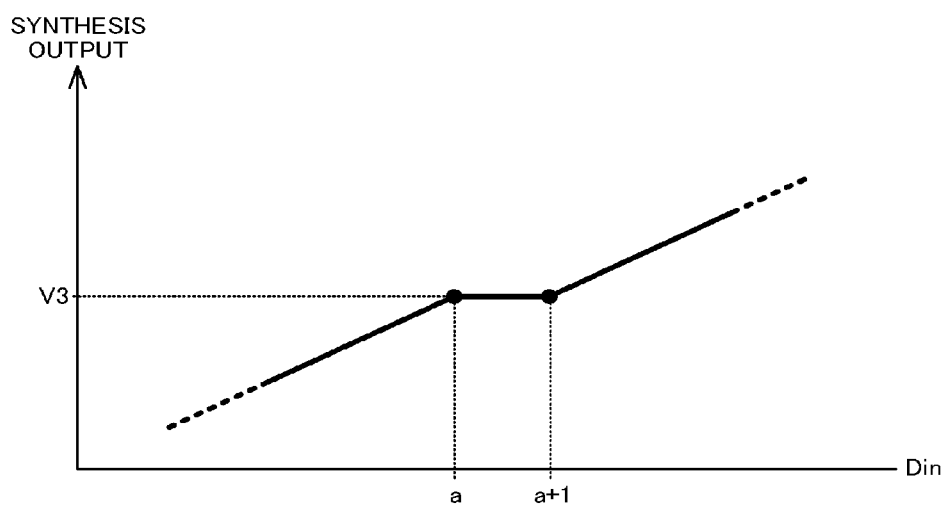
FIG. 8 is a diagram for explaining a correction of the strain of an output voltage.

In such a case, as illustrated in FIG. 8, even if the value of the input data Din(20) changes linearly, a synthesis output obtained by synthesizing the outputs by the respective D/A converters 202*a* to 202*d* remains the same. Hence, as is clear from FIG. 9, the upper 2 bits of the input data Din(20) is applied to add a voltage −d to the synthesis output as needed.

Hence, as illustrated in FIG. 5, the upper 2 bits of the input data Din(20) is provided for each D/A converter 202*a* to 202*d*, and takes four values that are 0, a1, a2, and a3. When this data is 0, the output voltage by the D/A converter 202*e* becomes zero, and when this data is a1, the output voltage by the D/A converter 202*e* becomes −dV. In addition, when this data is a2, the output voltage by the D/A converter 202*e* becomes −2dV, and when this data is a3, the output voltage by the D/A converter 202*e* becomes −3dV.

Hence, when the input data Din(20) is shifted from d−1 to d, the input data Din(20) is shifted from e to 0, and the input data Din(20) is shifted from a to a+1, the output voltage by the D/A converter 202*e* increases dV by dV, such as from −3dV to −2dV, from −2dV to −dV, and −dV to 0V. Accordingly, as illustrated in, for example, FIG. 9, the synthesis output comes to change linearly.

Returning to FIG. 3, the input data AD(20) is generated based on a correction table stored in a DPRAM 208 beforehand. The correction table is created based on data obtained when the deflection amplifier 200A is calibrated. The procedure of creating the correction table will be explained later.

Figure 10:
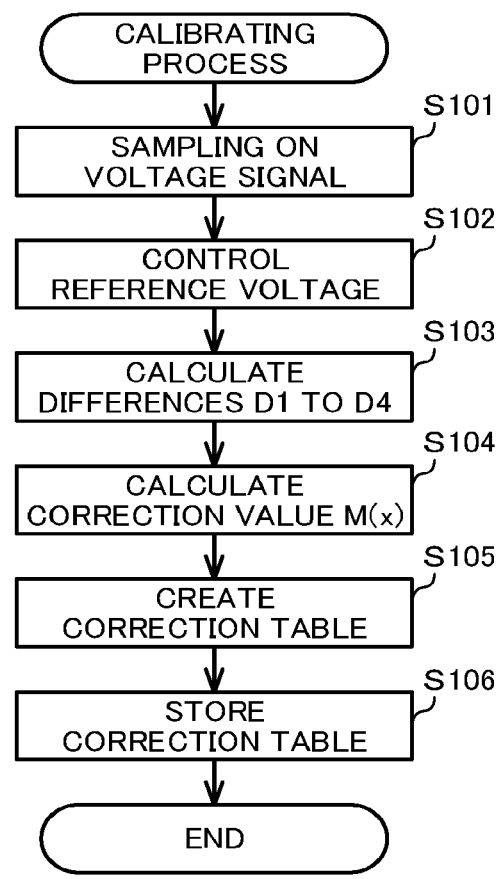
FIG. 10 is a flowchart illustrating sequential processes executed at the time of an output-voltage calibrating process.

The adder 207 synthesizes the outputs by the respective D/A converters 202*a* to 202*e*, and outputs the voltage signal Vout. As for the voltage signal Vout, the characteristic thereof is calibrated so as to be a linear characteristic relative to the input data Din(20). An explanation will be given below of the detail of the calibration of the voltage signal Vout with reference to FIG. 10. FIG. 10 is a flowchart illustrating sequential processes executed by the CPU 101*a* of the controller 101. Those processes are executed at a constant cycle and at a time point, such as at the time of the installation of the electron beam writing apparatus 10, and the time prior to starting the pattern writing.

Figure 11:
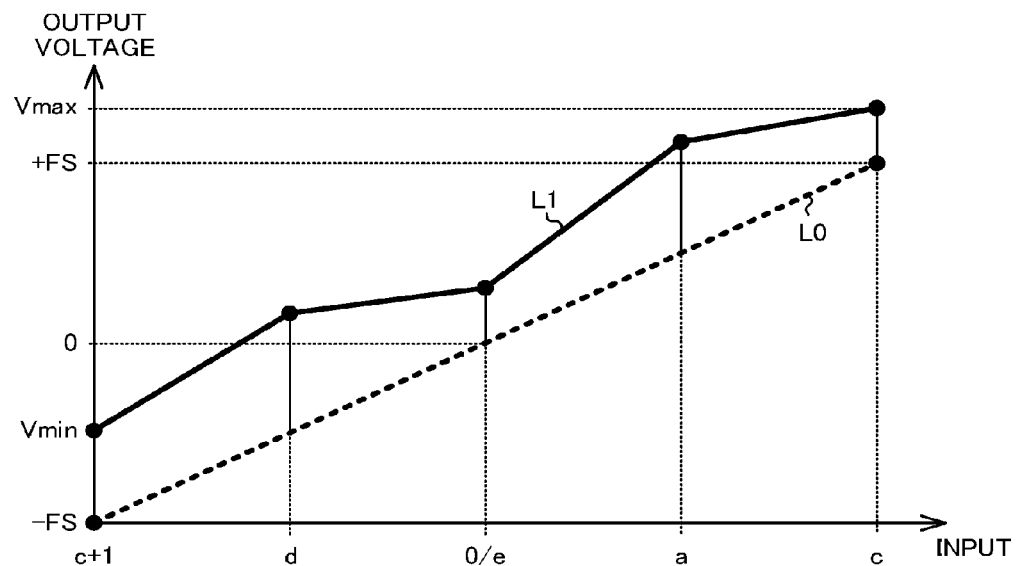
FIG. 11 is a diagram for explaining a calibrating process.

The voltage signal Vout is calibrated with the output of input data AD(16) from the DPRAM 208 being shut off. FIG. 11 is a diagram illustrating a change in voltage signal Vout. A solid line L1 in FIG. 11 indicates the voltage signal Vout prior to the calibration. In addition, a dashed line L0 indicates a target calibration value of the voltage signal Vout. The calibration of the voltage signal Vout is to cause the solid line L1 indicating the voltage signal Vout to be consistent with the dashed line L0.

In the calibration of the voltage signal Vout, first, the value of the input data Din(20) is set to be c, and c+1, and, sampling is performed on a maximum value Vmax of the voltage signal Vout and a minimum value Vmin thereof (step S101).

Figure 12:
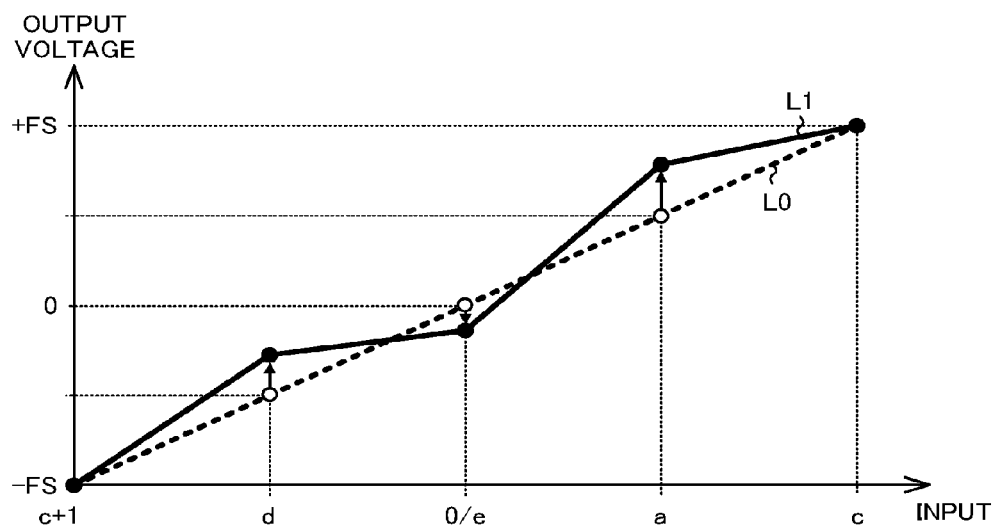
FIG. 12 is a diagram for explaining a calibrating process.

Next, as is clear from FIG. 12, the reference voltage Vref output by the voltage circuit 209 is controlled in such a way that the maximum value Vmax of the voltage signal Vout and the minimum value Vmin thereof fall in a predetermined value±FS (step S102). As illustrated in FIG. 3, in the deflection amplifier 200A, the reference voltage Vref output by the voltage circuit 209 is input to the respective D/A converters 202*a* to 202*e*. Hence, the respective gains of the D/A converters 202*a* to 202*e* are controlled at an equal rate.

Next, the value of the input data Din(20) is changed to c+1, d, 0, a, and c, one by one, and the differences D1, D2, D3, D4, and D5 between the value of the voltage signal Vout and the target calibration value are obtained (step S103). The respective magnitudes of the differences D1 to D5 are indicated by the respective dimensions of arrows in FIG. 12. In addition, the respective signs of the differences D1 to D5 are indicated by the respective directions of the arrows.

Next, a correction value M(x) when the input data Din(20) is within a range between c+1 and d is calculated (step S104). As explained above, the characteristics of the respective D/A converters 202*a* to 202*d* can be deemed as a linear characteristic. Hence, the correction value M(x) can be calculated from, for example, the following formula (1).

$$M(x) = -D1 + (x - (c+1)) \times (D2 - D1)/(d - (c+1)) \quad (1)$$

Likewise, correction values M(d) to M(e) when the input data Din(20) is within a range between d and e, correction values M(0) to M(a) when the input data Din(20) is within a range between 0 and a, and correction values M(a) to M(c) when the input data Din(20) is within a range between a to c, are respectively calculated from the following three formulae (2) to (4).

$$M(x) = -D2 + (x-d) \times (D3-D2)/(e-d) \quad (2)$$

$$M(x) = -D3 + (x-0) \times (D4-D3)/(a-0) \quad (3)$$

$$M(x) = -D4 + (x-a) \times (D5-D4)/(c-a) \quad (4)$$

When the correction values M(x) that are obtainable as explained above are calculated, those correction values M(x) are associated with the input data Din(20) to generate the correction table (step S105). FIG. 13 illustrates an example correction table. As illustrated in FIG. 13, by referring to the correction table, the correction value M(x) can be specified from the value of the input data Din(20). When, for example, the input data Din(20) is c, the correction value M(c) is specified, and when the input data Din(20) is 0, the correction value M(0) is specified. The correction table is stored in the DPRAM 208 (step S106). Accordingly, the calibration of the voltage signal Vout is completed.

As illustrated in FIG. 3, when the input data Din(20) is input into the deflection amplifier 200A, the DPRAM 208 that has stored therein the correction table searches in the correction table with the value of the Din(20) being as a search key, and specifies the correction value M(x). Next, 16-bit digital data that represents the correction value M(x) is output as the input data AD(16). A computing element 211 adds 4 bits of data to the end of the input data AD(16). The reason why the 4-bit of data is added is to let the 16-bit data output by the DPRAM 16 to be adaptive to the input bit number of the D/A converter 202e. The input data AD(16) to which the 4-bit of data is added is output to the adder 213 as the input data AD(20).

The adder 213 adds upper 2 bits of the Din(20) to the input data AD(20). Thus the input data D5 is generated. This input data D5 is input to the D/A converter 202e. The D/A converter 202e outputs a voltage based on the input data D5. The voltage output by the D/A converter 202e is equivalent to a voltage that obtained by synthesizing the voltage corresponding to the correction value M(x) with a voltage that compensates a voltage difference dV created at the boundary between the adjoining control ranges of the respective D/A converters 202a to 202d. Hence, as illustrated in FIG. 7, the voltage signal Vout output by the adder 207 has a linear characteristic.

Returning to FIG. 1, the deflection amplifier 200B generates a voltage signal based on the digital signal output by the controller 101, and outputs the generated voltage signal to the electrodes that construct the beam deflector 33. A potential difference V2 is produced across the electrodes that construct the beam deflector 33. Hence, the electron beam that passes through the beam deflector 33 is deflected by what corresponds to the potential difference V2. The deflection amplifier 200B employs the same structure as that of the deflection amplifier 200A explained above.

According to the electron beam writing apparatus 10 employing the above structure, when a writing start instruction to the material 120 is input to the controller 101, the CPU 101a that constructs the controller 101 utilizes the main memory 101b as a work area, and executes the program stored in the auxiliary memory 101c. Thereby, the electron beam writing apparatus 10 is totally controlled.

More specifically, the CPU 101a drives the stage 61 through the stage driver 107, and as illustrated in FIG. 1, positions the material 120 below the emitting unit 20.

Next, the CPU 101a applies a voltage to the electron gun 22 by driving the power-source 102. Hence, the electron gun 22 emits the electron beam.

When the electron gun 22 of the emitting unit 20 starts emitting the electron beam, the CPU 101a focuses the electron beam toward a desired position on the material 120 by driving the lens driver 104, and the deflection amplifiers 200A, 200B. Simultaneously, the CPU 101a output the blanking signal modulated based on writing data to the beam deflector 31 by driving the blanking amplifier 103. Through the above operations, a pattern is written in the material 120.

As explained above, according to this embodiment, the output characteristic of each D/A converter 202a to 202d that constructs each deflection amplifier 200A, 200B is substantially linear, and thus the linearity is ensured. Hence, a calibration can be carried out by measuring only the differences D1 to D5 at points corresponding to the boundaries of the control ranges assigned to the respective D/A converters 202a to 202d. That is, the calibration can be carried out by performing samplings by multiple times that is substantially the same as the number of D/A converters. Hence, the calibration of the electron beam writing apparatus 10 can be precisely carried out within a short time.

Figure 9:
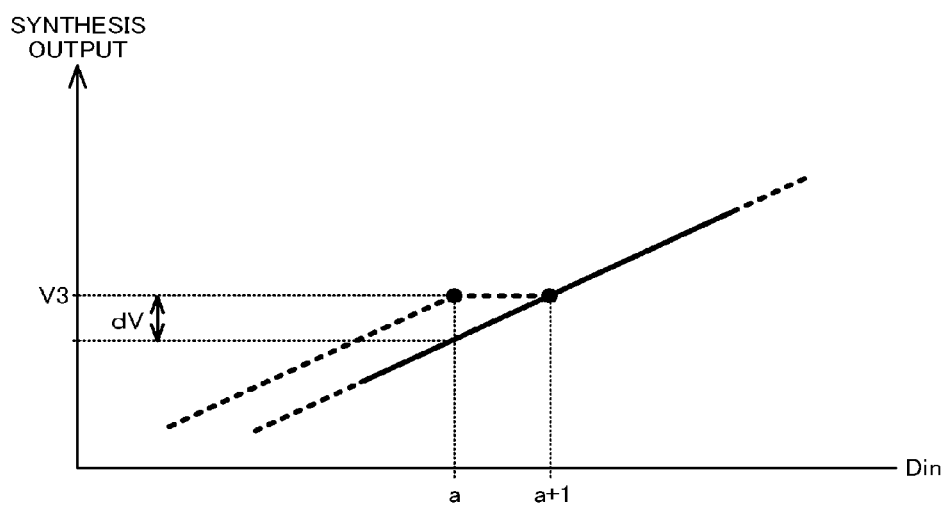
FIG. 9 is a diagram for explaining a correction of the strain of an output voltage.

In this embodiment, even if the value of the input data Din(20) changes beyond the boundary of the control range assigned to each D/A converter 202a to 202d, as is clear from FIG. 9, the voltage signal Vout changes linearly. Hence, the voltage signal Vout with an excellent linearity is outputtable.

Although the embodiment of the present disclosure was explained above, the present disclosure is not limited to the above embodiment. For example, according to the above embodiment, when the calibration is carried out, as is clear from FIG. 12, the differences D1 to D5 at points corresponding to the boundaries of the adjoining control ranges assigned to the respective D/A converters 202a to 202d are measured. The present disclosure is not limited to this case, and a difference between the boundary of the control range and the intermediate point of this control range may be measured, and, the calibration may be carried out based on this measurement result.

In the above embodiment, the explanation was given of an example case in which the respective outputs by the four D/A converters 202a to 202d are synthesized. The present disclosure is not limited to this case, and the deflection amplifiers 200A, 200B each may include equal to or less than three, or equal to or greater than five D/A converters.

In the above embodiment, the explanation was given of an example case in which the deflection amplifiers 200A, 200B each include the 20-bit D/A converters. The present disclosure is not limited to this case, and the D/A converter applied to the deflection amplifiers 200A, 200B may be a converter of other bits than 20 bits.

Figure 14:
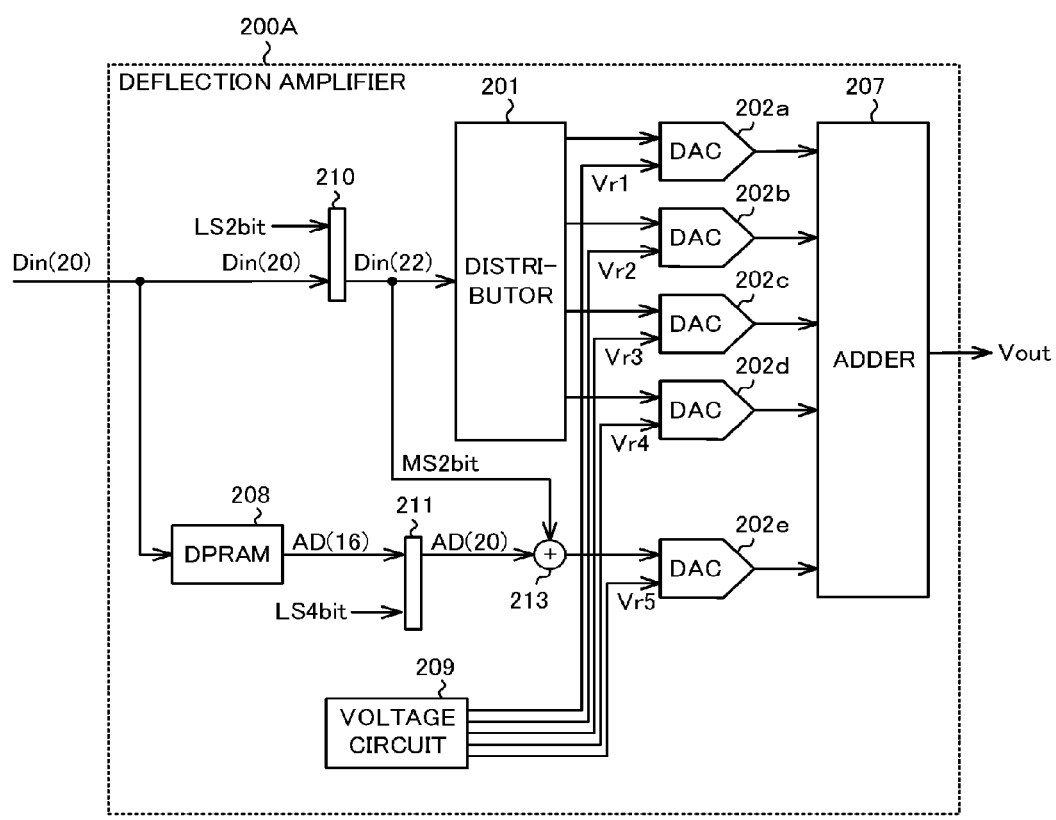
FIG. 14 is a schematic diagram illustrating a modified example of the deflection amplifier.

In the above embodiment, the explanation was given of an example case in which the reference voltage Vref for the D/A converters 202a to 202d that construct the deflection amplifiers 200A, 200B is supplied from the common voltage circuit 209. However, as illustrated in FIG. 14, reference voltages Vr1 to Vr4 may be input to the respective D/A converters 202a to 202d, and such reference voltages Vr1 to Vr4 may be individually changed so as to control all D/A converters 202a to 202d to have equal gains to one another. This makes it possible for the deflection amplifiers 200A, 200B to calibrate the characteristic of the voltage signal Vout to have a linear characteristic.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An output control method of controlling an output by a deflection amplifier that outputs a voltage signal to a deflection electrode of an electron beam writing apparatus, the voltage signal being proportional to input data, and the method comprising:
   performing, for the voltage signal generated by synthesizing respective outputs by a plurality of D/A converters to which a control range of the voltage signal is assigned, the respective outputs by the plurality of D/A converters being proportional to respective inputs, sampling on at least either a lower limit value of the voltage signal within the control range or an upper limit value thereof; and
   generating a correction value to correct the output by the D/A converter based on the sampling result.

2. The output control method according to claim 1, further comprising: controlling a minimum value of the voltage signal and a maximum value thereof to be respective preset appropriate values.

3. The output control method according to claim 1, wherein the correction value is a difference between a value of the output by the D/A converter and a target value of the voltage signal.

4. The output control method according to claim 3, wherein the correction value is calculated based on a linearity of the output by the D/A converter.

5. The output control method according to claim 4, wherein the correction value is a difference between a straight line which indicates the output by the D/A converter and which is defined by the upper limit value of the voltage signal and the lower limit value thereof, and, a straight line indicating the target value of the voltage signal.

6. An electron beam writing apparatus that writes a pattern by emitting an electron beam to a target object, the apparatus comprising:
   a deflection electrode that causes the electron beam emitted to the target object to be deflected; and
   a deflection amplifier that comprises:
      a synthesizer that synthesizes input voltages and outputs a voltage signal which is proportional to input data and which is input to the deflection electrode;
      a plurality of D/A converters to which a control range of the voltage signal is assigned, respective output voltages by the plurality of D/A converters being proportional to respective inputs;
      a storage which stores a correction value in association with the input data, and which outputs the correction value according to the input data; and
      a corrector D/A converter that outputs, to the synthesizer, a voltage with a value according to the correction value from the storage,
   wherein the correction value is generated based on at least either a lower limit value of the voltage signal within the control range assigned to each of the D/A converters or an upper limit value thereof.

7. The electron beam writing apparatus according to claim 6, wherein the correction value is generated by controlling a minimum value of the voltage signal and a maximum value thereof to be respective preset appropriate values, and based on at least either the lower limit value of the voltage signal within the control range assigned to each of the D/A converters or the upper limit value thereof.

8. The electron beam writing apparatus according to claim 7, wherein the correction value is a difference between a value of the output by the D/A converter and a target value of the voltage signal.

9. The electron beam writing apparatus according to claim 8, wherein the correction value is calculated based on a linearity of the output by the D/A converter.

10. The electron beam writing apparatus according to claim 9, wherein the correction value is a difference between a straight line which indicates the output by the D/A converter and which is defined by the upper limit value of the voltage signal and the lower limit value thereof, and, a straight line indicating the target value of the voltage signal.

11. The electron beam writing apparatus according to claim 6, wherein the storage stores a table that associates the correction value with the input data.

12. The electron beam writing apparatus according to claim 6, further comprising a controller that calculates the correction value.

13. The electron beam writing apparatus according to claim 12, wherein the controller outputs the input data to the deflection amplifier to control the deflection amplifier.

14. The electron beam writing apparatus according to claim 6, wherein when an upper limit value within a first control range is consistent with a lower limit value within a second control range that is defined as an upper range relative to the first control range, the corrector D/A converter superimposes, on the voltage signal within the second control range, a voltage by what corresponds to 1 bit of the input data.

* * * * *